United States Patent [19]
Sachdev

[11] Patent Number: 5,831,986
[45] Date of Patent: Nov. 3, 1998

[54] FAULT-TOLERANT MEMORY ADDRESS DECODER

[75] Inventor: Manoj Sachdev, Eindhoven, Netherlands

[73] Assignee: U.S. Philips Corporation, New York, N.Y.

[21] Appl. No.: 546,856

[22] Filed: Oct. 23, 1995

[30] Foreign Application Priority Data

Nov. 9, 1994 [EP] European Pat. Off. .............. 94203265

[51] Int. Cl.$^6$ .................................................. G11C 29/00
[52] U.S. Cl. .......................... 371/21.2; 365/201; 365/200; 371/21.2
[58] Field of Search ................................ 371/21.1, 21.2; 365/201, 200; 395/183.15

[56] References Cited

U.S. PATENT DOCUMENTS 5,357,470  10/1994  Namekawa et al. ..................... 365/200
5,398,212   3/1995  Imura et al. ........................ 365/230.08
5,436,910   7/1995  Takeshima et al. .................... 371/21.1

OTHER PUBLICATIONS

"A New Testing Acceleration Chip for Low–Cost Memory Tests", by M. Inoue et al, IEEE Design & Test of Computers, Mar. 1993, pp. 15–19.

"Efficient Algorithms for Testing Semiconductor Random Access Memories", by R. Nair et al, IEEE Trans. Computer, vol. C–27, pp. 572–576, Jun. 1978.

*Primary Examiner*—Phung M. Chung
*Attorney, Agent, or Firm*—Steven R. Biren

[57] ABSTRACT

Hard-open defects between logic gates of an address decoder and the voltage supply render a memory conditionally inoperative. The decoders are therefore examined for such hard-open defects. Two cells of two logically adjacent rows or columns are written with complementary logic data. If a Read operation reveals the data in the two cells to be identical, the presence and location of a hard-open defect in the decoders is demonstrated. Alternatively, the memory is provided with a fault-tolerant decoder that comprises additional disabling circuitry to properly disable the rows and columns even when a hard-open defect is present in the decoders' logic gates.

3 Claims, 4 Drawing Sheets

FAULT-TOLERANT MEMORY ADDRESS DECODER

BACKGROUND OF THE INVENTION

The invention relates to a method of testing a circuit that comprises a plurality of cells, input means operative to receive an address, and decoding means. The decoding means has a decoding input connected to the input means and a decoding output connected to the plurality of cells. The decoding means is operative to enable accessing the cells on the basis of the address. The invention also relates to such a circuit. The invention relates in particular, but not exclusively, to random-access memories (RAMs) and to read-only memories (ROMs).

Systematic and automatic testing of electronic circuitry, and of integrated circuits in particular, has become increasingly more important. Each next generation of circuits tends to develop ever higher component densities and an ever growing number of system functionalities. Individual circuits have become complicated to such an extent that process defects cannot be detected and located anymore save by exhaustive and expensive testing. Customers cannot be expected to accept circuitry products that show their hidden defects in operational use, thereby rendering, e.g., life support systems or aircraft control systems, unreliable. It is therefore of the utmost importance for both the manufacturer and the customer that tests are run to guarantee flawless operation of the circuit products.

Random access memories (SRAMs, DRAMs) are usually subjected to March tests and/or Data Retention tests. A March test traverses through all addresses and performs some Read and Write operations for each address. For example, in a typical March test each RAM location is read first and thereupon the complemented data is written back. In Data Retention tests, every cell is written and checked after a pre-specified wait-time to see whether or not current leakage has occurred that has affected the stored logic state. Memory cells in a bit oriented memory and groups of memory cells in a word-oriented memory are accessible only successively, thus giving rise to lengthy test procedures.

Conventional testing of semiconductor memories that have a storage capacity in the order of 1 Mbit or larger makes up a considerable percentage of the production costs. For, e.g., a 4 Mbit DRAM this percentage well amounts to 10%. For larger memories, this percentage increases even further as the time required to conduct the test grows with the storage capacity. For a 64 Mbit DRAM testing is estimated to cost 240 times as much as testing a 1 Mbit DRAM. This should imply that the ratio of the test cost and the total cost of a 64 Mbit DRAM then amounts to approximately 40%, which is unacceptably high. Accordingly, with increasing transistor densities and with increasing number of system functionalities that can be integrated on a semiconductor substrate (including wafer scale devices), prior art testing has become a major factor in determining the commercial viability of an IC memory product. For further information, see "A New Testing Acceleration Chip for Low-Cost Memory Tests", M. Inoue et al., IEEE Design & Test of Computers, March 1993, pages 15–19. The above may serve to show that testing is an essential step in the manufacturing of reliable memory products.

With growing memory complexities and decreasing feature sizes, the probability of address decoders having a defect has increased. It has been suggested that all decoder faults manifest themselves as matrix faults, see R. Nair et al., "Efficient Algorithms for Testing Semiconductor Random Access Memories", IEEE Trans. Computer, Vol. C-27, pages 572–576, June 1978. However, it has been found by the inventor that not all decoder faults can be simply mapped onto the memory matrix. This especially applies to those defects that occur inside of a logic gate in the decoder, such as a hard-open defect between a transistor of the gate and the voltage supply. It is impossible to exhaustively cover such failures by linear test algorithms.

SUMMARY OF THE INVENTION

It is therefore an object of the invention to provide a method to simply detect such decoder failures. It is another object to provide a memory with decoders whose operation is insusceptible to such hard-open failures.

The method of the invention is characterized by the following steps: supplying a first address to the input means for accessing a first one of the cells; writing a first logic state in the first cell; supplying a second address to the input means for accessing of a second one of the cells, the second address differing from the first address by one bit; writing a second logic state in the second cell; and reading the first cell after writing the second cell.

The invention is based on the insight that by sequentially altering the current address by one bit until all relevant addresses have been reviewed, the decoding means passes in a particular order through all physical states that can occur during operational use. Reading the first cell after completion of the Write operation conducted on the second cell should reveal the first cell still being in the first logic state if the functioning of the decoding means is flawless. If, however, the first cell turns out to have assumed the second logic state, then the first cell was overwritten during the Write operation of the second one. This procedure enables detection and location of a defect in the decoding means. The addresses may be the address information as supplied to the circuit from outside. Alternatively, the address may be information internal to the decoding means, e.g., indicative of the (partially) decoded addresses.

If the cells are arranged in rows and columns and the decoding means comprises row decoders and column decoders, all row addresses can be reviewed according to above method, and all column addresses can be reviewed according to above method in order to test the decoders. As is clear, the test complexity of the method according to the invention is marginal when compared to March tests conducted on the matrix itself.

The method of the invention represents one way of attacking the problem of faulty decoding means. Another way is to design fault-tolerant decoders, i.e., whose operation is not affected by a hard-open of the kind discussed above. Accordingly, the invention further provides a circuit as specified in the preamble, characterized in that the decoding means comprises a further input for receiving a control signal, and disabling means having a disable input connected to the further input and operative to disable the decoding output under control of the control signal.

The disabling means in the invention renders hard-open defects between the voltage supply and transistors in the logic gates of the decoding means harmless. The disabling means serve to provide a disabling mechanism in addition to the normal one that is controlled by the address. If the normal address controlled disabling mechanism does not function properly due to a hard-open, the additional disabling means ensure a logically flawless operation of the decoder. This built-in fault tolerance of the decoding means lets the decoder circuitry as well as the cells keep on functioning correctly despite the presence of such defects. This fault-tolerance is preferably achieved by having the disabling means operative to enable the decoding means to logically combine the address with the control signal so as to disable any decoder output that otherwise would be active due to a hard-open defect.

The invention is in particular, but not exclusively, relevant to SRAM, DRAM and ROM circuits. Nevertheless, other arrangements of cells that are addressable through address decoders, e.g., a CCD device or a flat panel display (FPD) such as a liquid crystal display (LCD), benefit from the invention as well.

BRIEF DESCRIPTION OF THE DRAWING

The invention is explained by way of example and with reference to the accompanying drawing, wherein.

DESCRIPTION OF THE PREFERRED EMBODIMENTS

Cell Matrix

Figure 1:
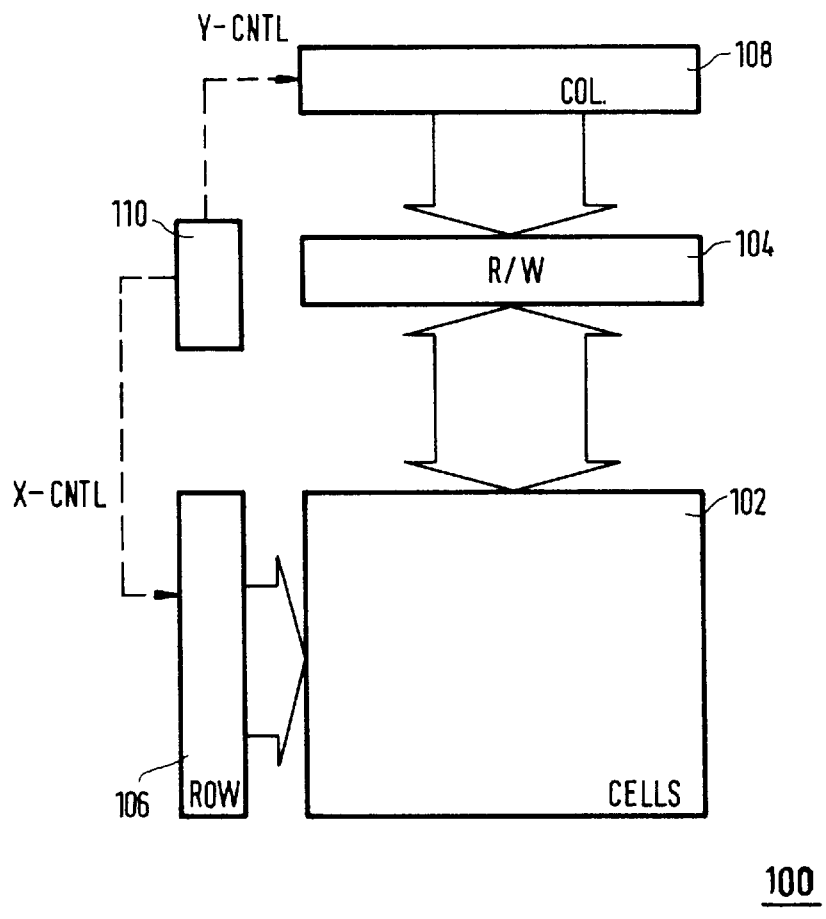
FIG. 1 is a block diagram of a cell matrix with address decoders.

FIG. 1 is a diagram of circuit 100 comprising a plurality of cells 102 arranged in a matrix of rows and columns. Access to the cells 102 of the matrix is achieved via Read/Write logic 104 through row decoding means 106 and column decoding means 108. An address supplied to decoding means 106 activates a selected one of the rows (or word lines), and an address supplied to decoding means 108 enables a selected one of the columns. A control unit 10 generates control signals X-cntl and Y-cntl for controlling the timing of the address supply to decoding means 106 and 108. Typically, control signals X-cntl and Y-cntl are pulse-shaped and periodic signals.

Transistor Scheme of Decoding Logic

Figure 2:
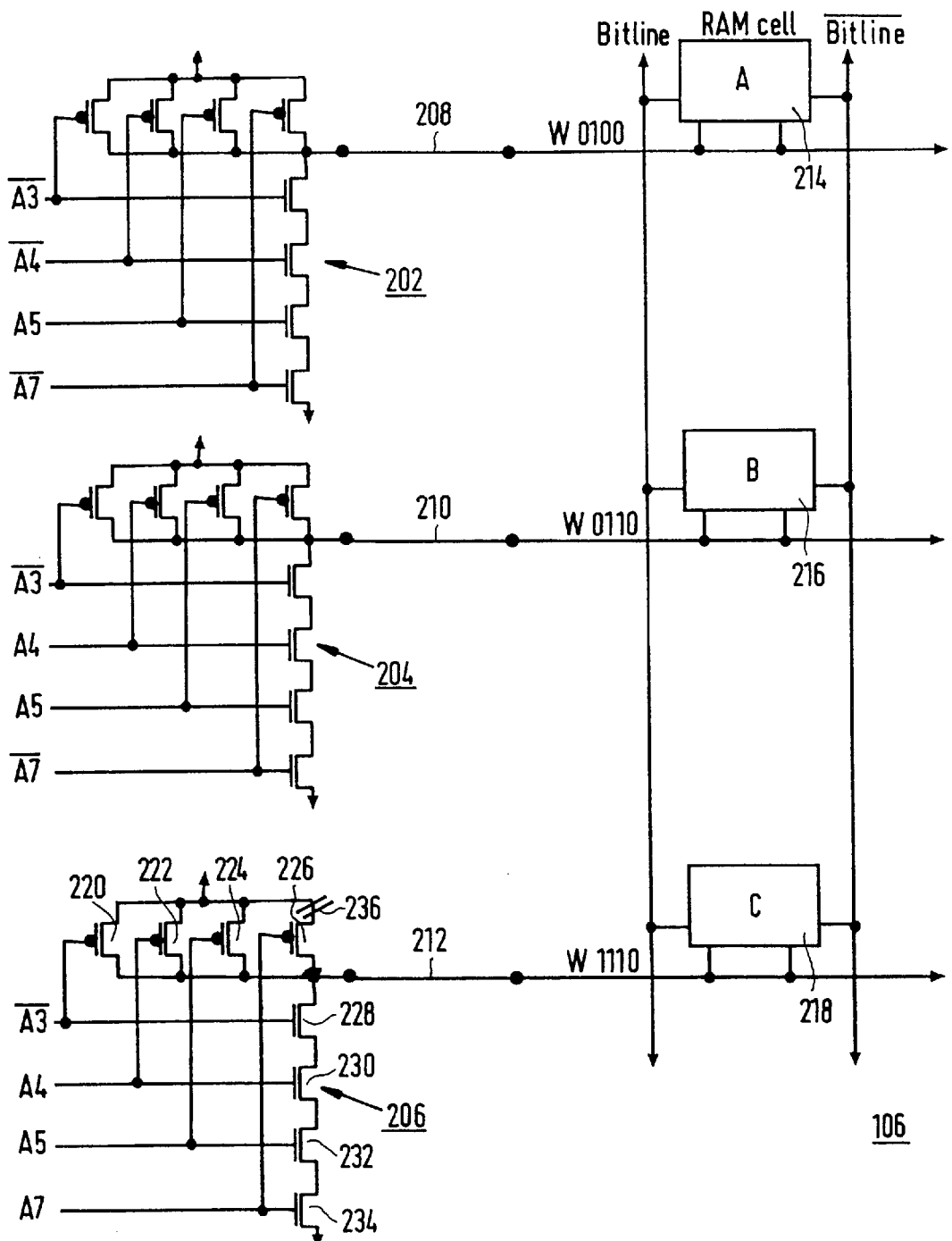
FIG. 2 is a transistor diagram of a part of a conventional address decoder in an SRAM.

FIG. 2 is an example of a transistor diagram of decoding means 106 of FIG. 1 to explain a failure stemming from a hard-open defect. Decoding means 106 includes a plurality of uniform logic NAND gates 202, 204 and 206 that serve word lines 208, 210 and 212, respectively, via respective word line drivers (not shown). Cells 214, 216 and 218 are connected to word lines 208, 210 and 212, respectively. In this example, cells 214–218 are assumed to be located in the same column for ease of reference. Word lines 208–212 are selected by an appropriate combination of address bits A3, A4, A5 and A7 and their logic complements $\underline{A3}$, $\underline{A4}$, $\underline{A5}$ and $\underline{A7}$. NAND gate 202 receives $\underline{A3}$, $\underline{A4}$, A5 and $\underline{A7}$. NAND gate 204 receives $\underline{A3}$, A4, A5 and $\underline{A7}$. NAND gate 206 receives $\underline{A3}$, A4, A5 and A7. A particular one of word lines 208–212 is enabled when the associated one of NAND gates 202–206 supplies a logic low, that is, when all address bits received are logic high.

As NAND gates 202–206 are uniform, only NAND gate 206 is discussed in further detail. NAND gate 206 comprises four PFETs 220, 222, 224 and 226 arranged in parallel between supply voltage VDD and word line 212, and four NFETs 228, 230, 232 and 234 arranged in series between word line 212 and GND. FETs 220–234 are connected in pairs to be controlled mutually complementarily through address bits $\underline{A3}$, A4, A5 and A7. Word line 212 is selected or enabled by having $\underline{A3}$, A4, A5 and A7 all logic high, thus pulling word line 212 low by turning NFETs 228–234 on and turning PFETs 220–226 off. Word line 212 is disabled by pulling it high via one of PFETs 220–226.

Assume that NAND gate 206 has a hard-open defect 236 between PFET 226 and VDD. That is, the coupling between the source of PFET 226 and supply voltage VDD has a resistance that is too high to disable word line 212 properly, i.e., to have word line 212 pulled high via PFET 226. If word line 212 is to be disabled by enabling word line 210, the result is that both lines 210 and 212 are enabled since PFET 226 is inoperative. A Write operation meant to write cell 216 therefore is also performed on cell 218. However, if word line 208 is enabled, word line 212 is properly disabled as PFET 222 is turned on. Accordingly, defect 236 can be detected by writing cell 216 immediately after cell 218 was accessed, e.g., by first having a logic state written into cell 218 and thereupon writing the logic complement into cell 216. Comparing the data stored in cells 216 and 218 then reveals that both cells have the same logic state as cell 218 was overwritten. If instead cell 214 would have been written immediately after cell 218 was accessed, word line 212 would be properly disabled via PFET 222 and defect 236 would go undetected.

Although open defects occur to a lesser degree than short circuit defects in modern CMOS processes, the probability of an open defect is still not negligible as the decoders comprises a large number of multiple-input logic gates such as the NAND gates in the example shown. March tests conducted on the cell matrix and using addresses in ascending or descending order are not capable of exhaustively detecting defects such as defect 236 discussed above. This type of defect can only be detected by a conventional linear test algorithm if sequential behaviour, i.e., history-dependent behaviour, does not occur.

Address Decoder

Figure 3:
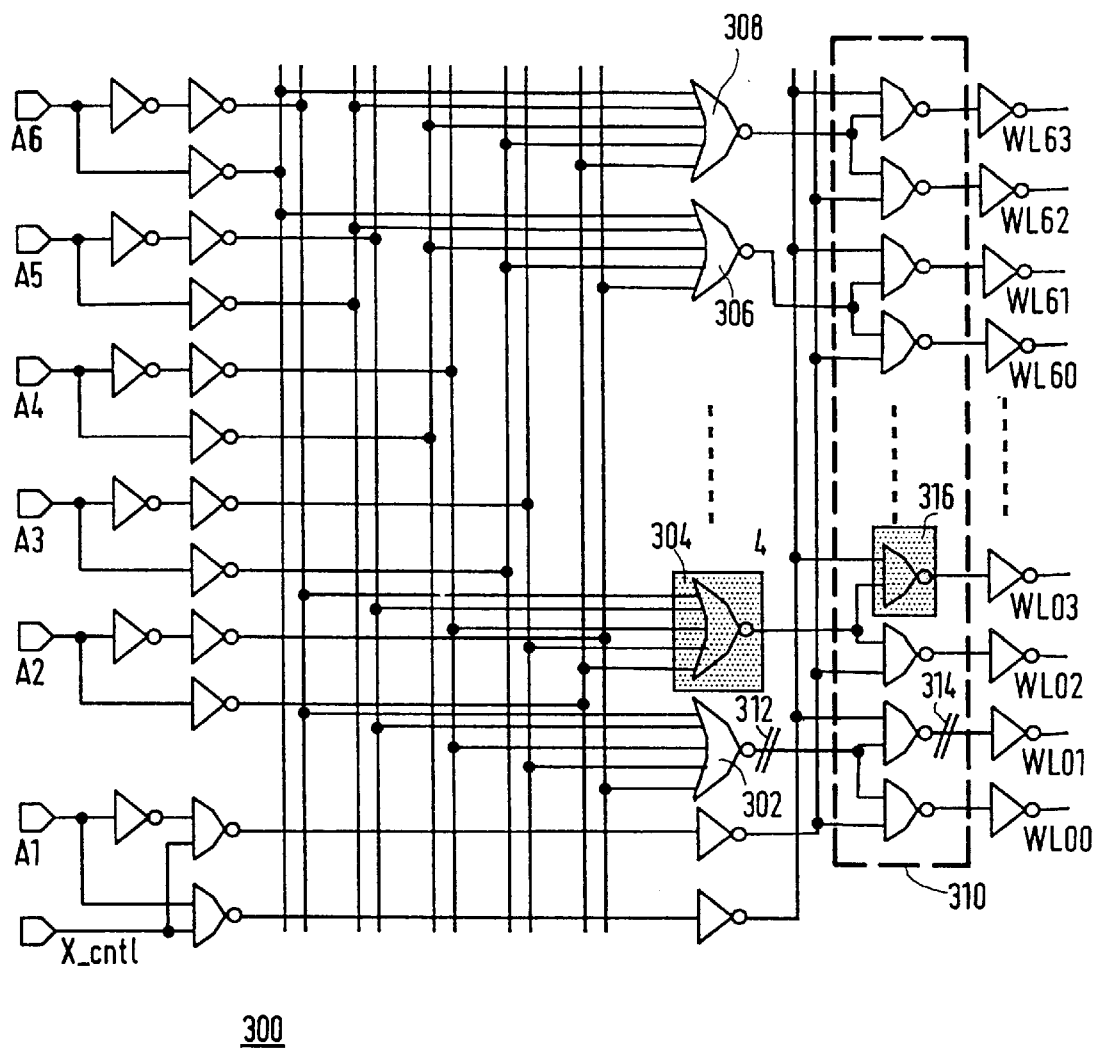
FIG. 3 is a logic diagram of another conventional address decoder.

FIG. 3 is a logic diagram of a typical 6-bit row address decoder 300 in an SRAM (not shown). Decoder 300 is operative to decode address bits A1, A2, A3, A4, A5 and A6 into enable/disable signals for 64 word lines WL00, WL01, WL02, ..., WL63. Decoder 300 uses NOR gates instead of the NAND gates discussed above. It will be clear to the person skilled in the art that this difference is not relevant to the essence of the invention.

Decoder 300 comprises 5-input NOR gates 302, 304, ..., 306 and 308 to decode bits A2–A6. Bit A1 is decoded via an arrangement 310 of 2-input NAND gates after having been logically combined with control signal X-cntl. Several hard-open defects are discussed below.

First consider an open defect causing a breach in an interconnect line between two logic gates, such as defects 312 and 314. Defects 312 and 314 manifest themselves as stuck-at failures of the RAM cells (not shown) connected to word lines WL00 and WL01, and are detectable by a linear algorithm such as "6N".

Hard-open defects inside of a logic gate are of a completely different category as they may affect the operation of only a single transistor. Consider a hard-open defects to occur in NAND gate 316, causing the source of a PFET (not shown) of NAND gate 316 to be disconnected from the voltage supply VDD. Since there is only one other PFET (not shown) in NAND gate 316, the defective transistor is detected by either an ascending or a descending March test in the address space. More particularly, the input data of faulty NAND gate 316 should be changed according to a Gray code. This implies that A1 and decoded A6–A2 bits should change in a Gray code manner. If the number of inputs to the NAND gate would have been three or more the detection of the failure cannot be guaranteed. This is because the other PFETs arranged in parallel to the defective PFET could hide the fault's effect. This causes the decoder to show a sequential, i.e., history dependent, behaviour instead of a combinatorial behaviour as explained above with reference to FIG. 2.

A similar reasoning applies, mutatis mutandis, to a hard-open failure in NOR gate 304. At least three open defects of the relevant NFETs (not shown) in NOR gate 318 may go undetected under a conventional March test. NOR gates 302–308 may therefore be sequentially tested as follows in order to detect hard-opens. For a particular one of NOR gates 302–308 a logic low is written to a selected cell (not shown) of the corresponding one of word lines WL00–WL63, while bit A1 is kept low. Change the word line address by only a single bit. This should disable the particular NOR gate via a specific NFET (not shown) of the NOR gate if the NFET would function correctly. Thereupon, a logic high is written in a selected cell (not shown) of the word line corresponding to the new address. If the specific NFET had an open defect, then the cell, which was written when the previous address was valid, is written again. A subsequent Read operation of the previous cell should reveal if the previous cell was overwritten or not. A second new word line address then is generated differing by one bit from the first new word line address, and a logic low is written in a selected cell corresponding to the second new word line. Reading the cell of the first new word line then should reveal if the latter was overwritten or not, and so on.

Accordingly, successively changing the word line addresses by one bit and alternately writing a logic low and a logic high, followed by a Read operation on the cell that was written during the last but one Write cycle should enable detection of a hard-open inside of a logic gate.

Modified Address Decoder

Figure 4:
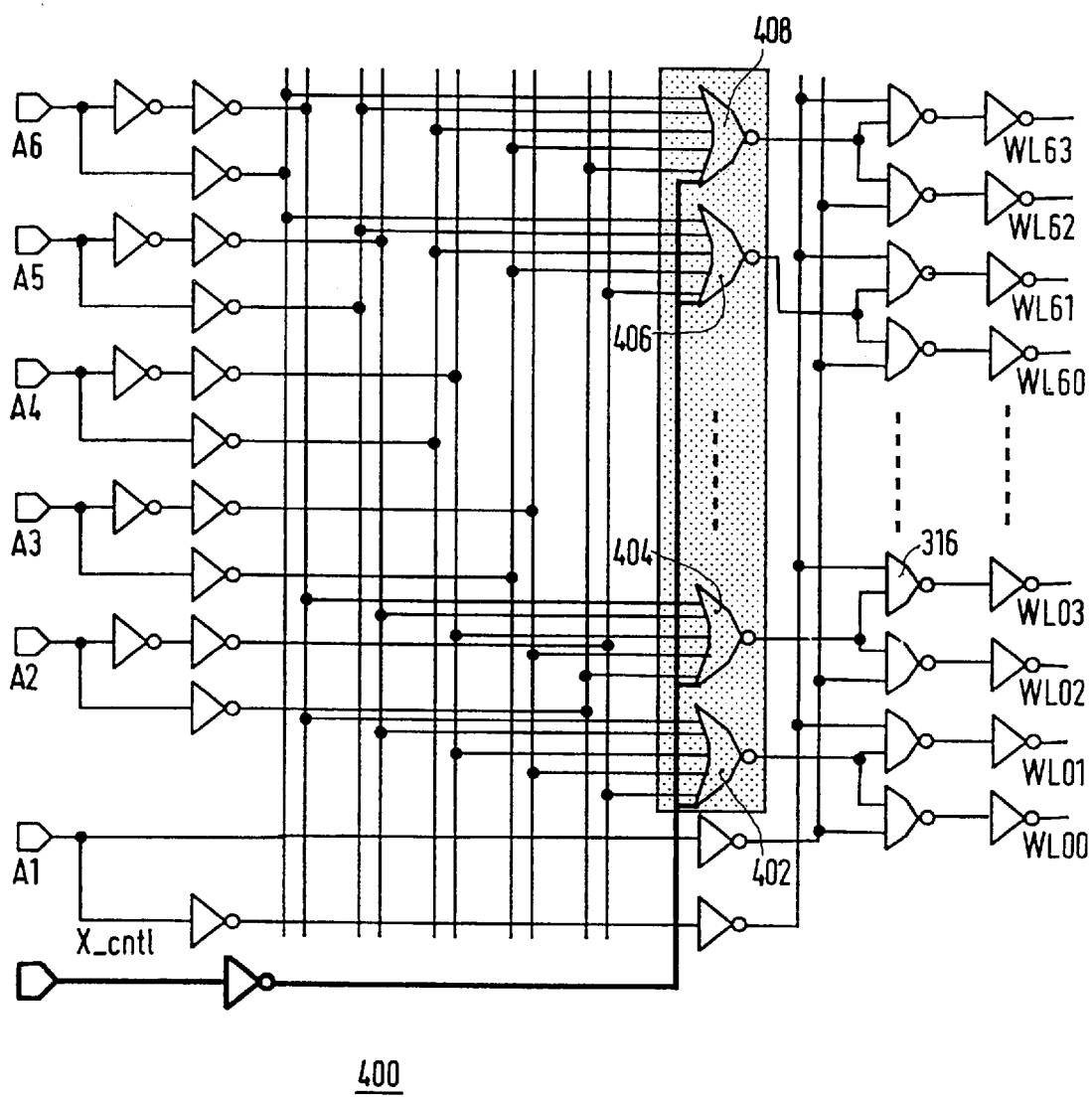
FIG. 4 is a logic diagram of an address decoder with built-in fault-tolerance.

FIG. 4 is a logic diagram of a row address decoder 400 of the type shown in FIG. 3, but now modified by measures to safeguard against hard-opens inside of the decoder's logic gates, so that both the decoder and the memory function correctly despite hard-open defects. The above test procedure then needs not be executed.

The discussion of FIG. 3 illustrates the difficulties involved in discovering a hard-open defect that affects the operation of a single transistor in the disabling path of a logic gate in the decoder. For instance, the disabling paths in a NAND gate are formed by a parallel arrangement of PFETs, and in a NOR gate by a parallel arrangement of NFETs. The invention now provides an additional disabling path that is activated between successive access (Read, Write, Refresh) operations.

In the example shown, decoder 400 is provided with 6-input NOR gates 402, 404, 406 and 408 instead of with 5-input NOR gates as in decoder 300 of FIG. 3. NOR gates 402–408 now each have an additional disabling path in order to disable the associated ones of word lines WL00–WL63. The disabling path is formed by the sixth one of the six NFETs (not shown) arranged in parallel between the output of the relevant NOR gate and GND, the other five NFETs function similarly to those in NOR gates 302–308 in decoder 300. In this example a sixth PFET (not shown) is added to avoid logical conflicts and to enable utilizing standard lay-outs for NOR gates 402–408, although the sixth PFET is functionally not essential to the invention in a strict sense. The sixth NFET and the sixth PFET are controlled via a periodic control signal X-cntl, e.g., derived from the RAM clock. Control signal X-cntl serves to disable word lines WL00–WL63 through control of NOR gates 402–408 between successive access cycles so that overwriting of a cell written previously or data conflicts will not occur. Instead of bit A1 in decoder 300, control signal X-cntl now controls the propagation of address bits A6–A2, so that the logic combination of A1 with X-cntl, as used in decoder 300, can be dispensed with.

I claim:

1. A method of testing a circuit that comprises a plurality of cells, input means operative to receive an address, and decoding means between the input means and the plurality of cells and operative to enable addressing of the cells on the basis of the address, characterized in that the method comprises:

supplying a first address to the input means for accessing a first one of the cells;

writing a first logic state in the first cell;

supplying a second address to the input means for accessing of a second one of the cells, the second address differing from the first address by one bit;

writing a second logic state in the second cell; and reading the first cell after writing the second cell to determine whether the first cell was overwritten during the write operation of the second cell.

2. The method of claim 1, wherein the plurality of cells are arranged in a plurality of rows and a plurality of columns, and wherein the decoding means comprises a plurality of row decoders, and wherein the method enables testing first and second ones of the row decoders by having the first address and the second address represent respective ones of the rows.

3. The method of claim 1, wherein the plurality of cells are arranged in a plurality of rows and a plurality of columns, and wherein the decoding means comprises a plurality of column decoders, and wherein the method enables testing first and second ones of the column decoders by having the first address and the second address represent respective ones of the columns.

* * * * *